(12) United States Patent
Moore

(10) Patent No.: US 8,687,363 B2
(45) Date of Patent: Apr. 1, 2014

(54) ENCLOSURE WITH DUCT MOUNTED ELECTRONIC COMPONENTS

(75) Inventor: Christopher Todd Moore, Troutville, VA (US)

(73) Assignee: General Electric Company, Schenectady, NY (US)

(*) Notice: Subject to any disclaimer, the term of this patent is extended or adjusted under 35 U.S.C. 154(b) by 85 days.

(21) Appl. No.: 13/460,967

(22) Filed: May 1, 2012

(65) Prior Publication Data

US 2013/0292095 A1 Nov. 7, 2013

(51) Int. Cl.
*H05K 7/20* (2006.01)

(52) U.S. Cl.
USPC .................. 361/690; 361/694; 361/695

(58) Field of Classification Search
None
See application file for complete search history.

(56) References Cited

U.S. PATENT DOCUMENTS

| | | | | | |
|---|---|---|---|---|---|
| 3,961,666 | A | * | 6/1976 | Suzuki et al. | 165/129 |
| 4,241,380 | A | * | 12/1980 | Lehmann et al. | 361/690 |
| 4,535,386 | A | * | 8/1985 | Frey et al. | 361/714 |
| 5,089,935 | A | * | 2/1992 | Ito | 361/692 |
| 5,276,584 | A | * | 1/1994 | Collins et al. | 361/718 |
| 5,398,159 | A | * | 3/1995 | Andersson et al. | 361/695 |
| 5,777,846 | A | * | 7/1998 | Hayes et al. | 361/690 |
| 6,127,603 | A | * | 10/2000 | Nichols | 800/284 |
| 6,127,663 | A | * | 10/2000 | Jones | 219/553 |
| 6,175,494 | B1 | * | 1/2001 | Komatsu | 361/692 |
| 6,459,577 | B1 | * | 10/2002 | Holmes et al. | 361/690 |
| 6,504,714 | B1 | * | 1/2003 | Richter | 361/695 |
| 7,182,208 | B2 | * | 2/2007 | Tachibana | 211/26 |
| 7,355,848 | B1 | * | 4/2008 | Hodge et al. | 361/690 |
| 7,742,298 | B2 | * | 6/2010 | Kunz | 361/690 |
| 2002/0046853 | A1 | | 4/2002 | Stendardo et al. | |
| 2005/0280493 | A1 | | 12/2005 | Edmunds et al. | |
| 2009/0180251 | A1 | * | 7/2009 | Biagini et al. | 361/690 |
| 2010/0320342 | A1 | | 12/2010 | Moore et al. | |
| 2011/0019362 | A1 | * | 1/2011 | Krietzman | 361/690 |

OTHER PUBLICATIONS

U.S. Appl. No. 13/357,281, filed Jan. 24, 2012, Moore, et al.
GE Energy, Title: Mark VIe Gas Turbine Control for Retrofit Applications, dated Jun. 7, 2004, pp. 1-22.
NEMA, Title: NEMA Enclosure Types, dated Nov. 2005, pp. 1-9.

* cited by examiner

*Primary Examiner* — Gregory Thompson
(74) *Attorney, Agent, or Firm* — Sutherland Asbill & Brennan LLP

(57) ABSTRACT

The present application provides for an enclosure for mounting electrical components therein. The enclosure may include a base, a roof, a number of side walls, and one or more support ducts extending from the base to the roof. The supports ducts may include an air channel therein extending from the base to the roof.

19 Claims, 3 Drawing Sheets

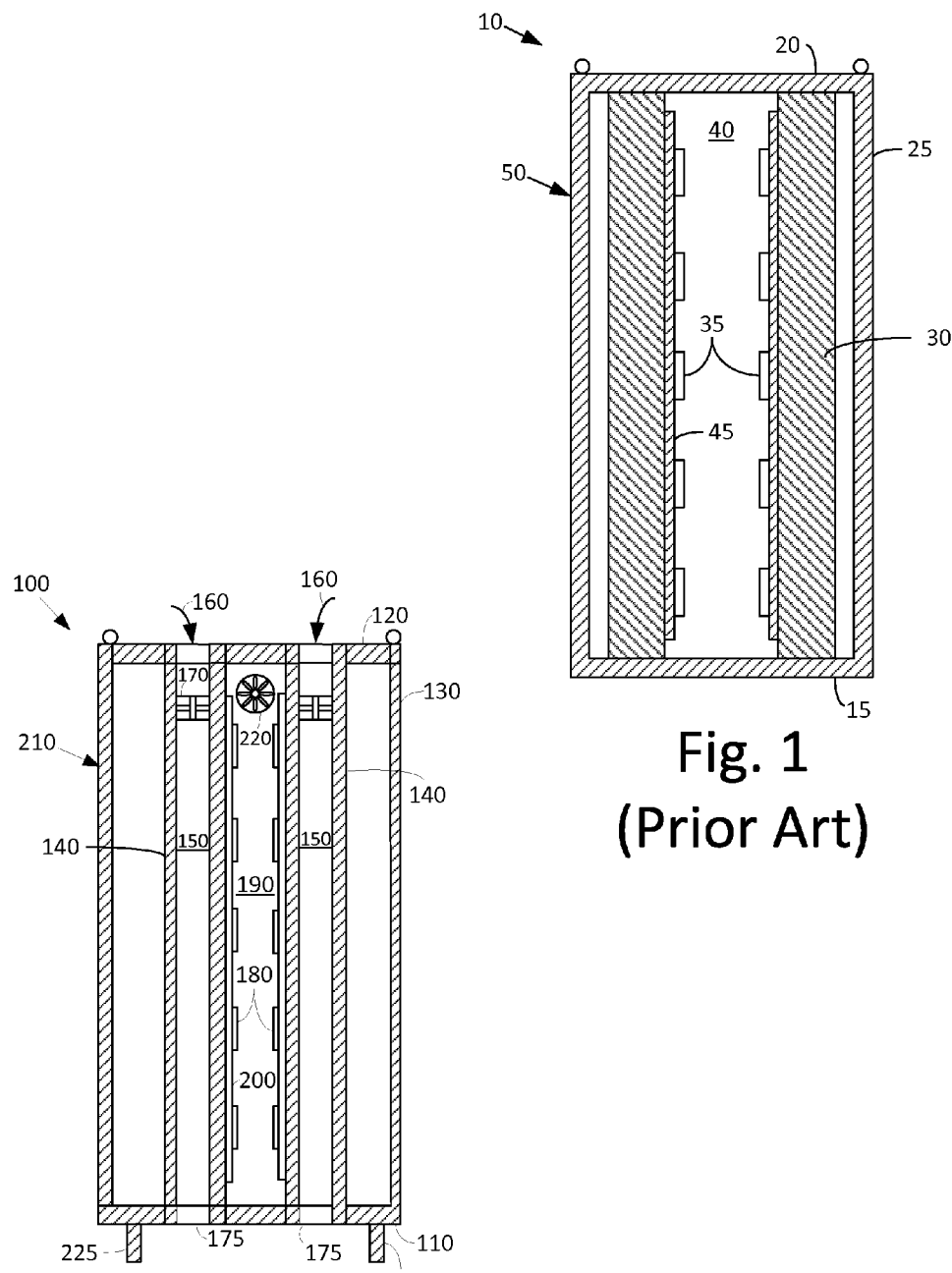

_US 8,687,363 B2_

ENCLOSURE WITH DUCT MOUNTED ELECTRONIC COMPONENTS

TECHNICAL FIELD

The present application and the resultant patent relate generally to enclosures for use with electrical components and more particularly relate to a sealed enclosure with duct mounted electrical components therein and with a cooling flow through the duct.

BACKGROUND OF THE INVENTION

Electronic control systems such as power plant control systems and the like generally are densely packed within an enclosure. Such densely packed electrical components may result in relatively high operating temperatures. These high operating temperatures and other thermal considerations may have a bearing on the minimum form factor to which the control systems may be designed, the maximum operating speeds, and the overall performance of the control systems.

Moreover, industrial control system customers generally intend to place such control systems in locations where ambient temperatures may be high and environmental contaminants such as dust, salt, debris, and the like may be common. The degree of protection provided by any given enclosure thus may be dictated by the area in which the enclosure is to be located. The National Electrical Manufacturers Association ("NEMA") defines different types of enclosures by the location of the enclosure and the various elements that the enclosure must be able to withstand. For example, a fan cooled NEMA 12 enclosure is arranged with filtered inlets and outlets. As such, a certain amount of downtime may be required for the filters to be cleaned periodically. A sealed NEMA 4 enclosure may offer good protection in dusty or wet environments, but such an enclosure may handle less of an internal heat load than a ventilated counterpart. There is thus somewhat of a tradeoff in operational parameters when selecting an enclosure for a particular purpose and location.

There is thus a desire for an improved enclosure for electrical components and the like. Preferably such an enclosure will be largely sealed to prevent the ingress of containments while being able to operate in temperature ranges typically associated with ventilated enclosures. Moreover, the enclosures should be relatively inexpensive to construct and operate as compared to known enclosures while providing enhanced protection to the electrical components therein.

SUMMARY OF THE INVENTION

The present application and the resultant patent thus provide for an enclosure for mounting electrical components therein. The enclosure may include a base, a roof, a number of side walls, and one or more support ducts extending from the base to the roof. The supports ducts may include an air channel therein extending from the base to the roof.

The present application and the resultant patent further provide a method of operating electrical components. The method may include the steps of positioning the electrical components about a support duct within an interior of an enclosure, sealing the interior of the enclosure, providing a flow of ambient air through an air channel of the support duct from a base to a roof of the enclosure, and exchanging heat with the electrical components on the support duct and the flow of the ambient air in the air channel.

The present application and the resultant patent further provide a sealed enclosure for mounting electrical components therein. The sealed enclosure may include a base, a roof, a number of side walls, a number of support ducts extending from the base to the roof, an air channel extending within the supports ducts from the base to the roof, and a duct fan positioned in the air channel of the support ducts.

These and other features and improvements of the present application and the resultant patent will become apparent to one of ordinary skill in the art upon review of the following detailed description when taken in conjunction with the several drawings and the appended claims.

BRIEF DESCRIPTION OF THE DRAWINGS

FIG. 1 is a side cross-sectional view of a known enclosure with electrical components therein.

FIG. 2 is a side cross-sectional view of an enclosure as may be described herein.

DETAILED DESCRIPTION

Figure 3:
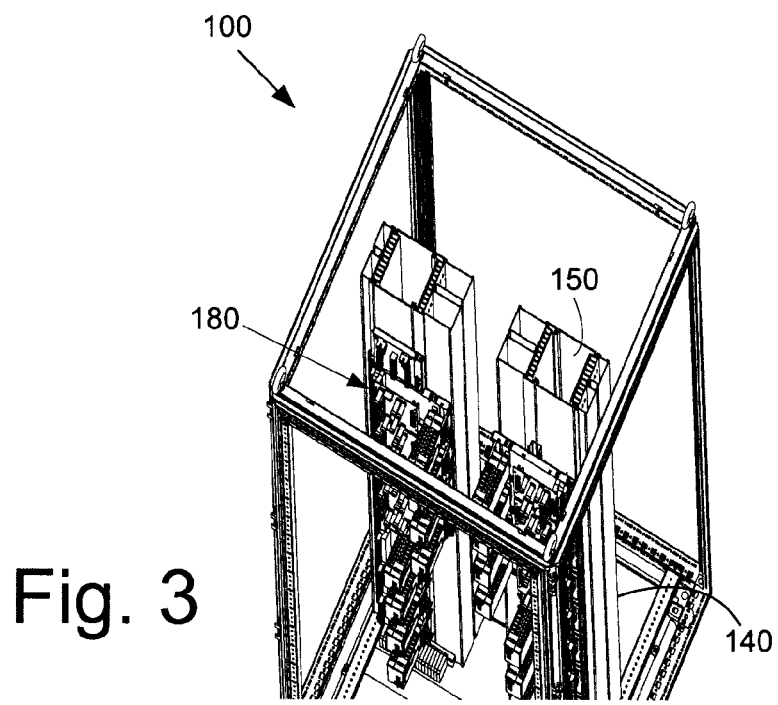
FIG. 3 is a partial perspective view of the enclosure of FIG. 2 with electrical components therein.

Referring now to the drawings, in which like numerals refer to like elements throughout the several views, FIG. 1 shows a side cross-sectional view of a known enclosure 10. Generally described, the enclosure includes a base 15, a roof 20, and a number of sidewall 25. The overall enclosure 10 may be of any size, shape, or configuration. The base 15, the roof 20, and the sidewall 25 may be made out of a sheet metal or other types of substantially rigid materials intended for use in relatively hostile conditions.

The enclosure 10 may include a number of internal support beams 30 positioned therein. The support beams 30 may have any size, shape, or configuration. The support beams 30 may extend from the base 15 to the roof 20. The support beams 30 may be made out of steel or other types of substantially rigid materials. Any number of the support beams 30 may be used.

A number of electrical components 35 may be positioned in an interior 40 of the enclosure 10. Specifically, the electrical components 35 may be mounted on a rail 45. The rail 45 may be positioned about the support beams 30. Any number or any type of the electrical components 35 may be used herein. As described above, the electrical components 35 tend to generate heat in operation. As such, the electrical components 35 may have limits on operations above certain ambient or internal temperatures. An access port of some sort may be positioned about the enclosure 10 so as to provide access to the electrical components 35 within the interior 40 of the enclosure 10. Although the enclosure 10 shown herein is a sealed enclosure 50, other types of ventilated enclosures also are known.

FIG. 2 and FIG. 3 show an example of an enclosure 100 as may be described herein. Generally described, the enclosure 100 includes a base 110, a roof 120, and a number of sidewalls 130. The enclosure 100 and the components thereof may have any size, shape or configuration. The base 110, the roof 120, and the sidewalls 130 may be made out of sheet metal and other substantially rigid materials intended for use in relatively hostile environments. Other components and other configurations may be used herein.

Instead of the support beams 30 described above, the enclosure 100 may include a number of support ducts 140. The support ducts 140 may define an air channel 150 therein. The support ducts 140 and the air channels 150 may extend from the base 110 to the roof 120 and may be in communication with an ambient air flow 160 that may be external to the enclosure 100. The support ducts 140 may be made out of steel or any type of rigid materials sufficient to support the enclosure 100 while also having good heat transfer characteristics. The support ducts 140 and the air channels 150 may have any desired size, shape, or configuration. Any number of the support ducts 140 may be used herein. One or more duct fans 170 may be positioned within the support ducts 140. The duct fans 170 may be any type of conventional air moving device and the like. The air channels 150 may be enclosed by a screen 175 or other structure that prevents debris from passing therethrough without blocking the ambient air flow 160. Other components and other configurations may be used herein.

The enclosure 100 also may have any number of electrical components 180 positioned therein. The electrical components 180 may include a number of circuit boards, or any type of electrical elements, passive or active. For example, resistors, inductors, capacitors, diodes, transistors, integrated circuits, logic gates, microcontrollers, microprocessors, digital signal processors, floating point gate arrays, memories, static random access memories, dynamic random access memories, read only memories, cable connectors, jumper connectors, or combinations thereof may be used herein. One or more of the electrical components 180 may dissipate electrical energy and therefore generate heat. Other components and other configurations may be used herein.

The electrical components 180 may be mounted in an interior 190 of the enclosure 100. Specifically, the electrical components 180 may be mounted on a rail 200, a similar structure, or directly on the support ducts 140. The rail 200, in turn, may be mounted on or about the support ducts 140. The electrical components 180 may be mounted in any conventional manner. The rail 200 likewise may be made out of any substantially rigid material with good heat transfer characteristics. Other components and other configurations also may be used herein.

The enclosure 100 thus may be a sealed enclosure 210 with respect to the interior 190 while the support ducts 140 allow an ambient air flow 160 to pass through the air channel 150 so as to provide cooling. One or more interior fans 220 may be mounted within the interior 190 of the enclosure 100. The interior fans 220 may be any type of air movement device. The base 110 of the enclosure 100 may be raised off of the ground via one or more supports 225. The supports 225 may be rails, feet, or any other structure that is integral or not. An access port of some sort may be positioned about the enclosure 100 so as to provide access to the electrical components 180 within the interior 190 of the enclosure 100. Other components and other configurations may be used herein.

Figure 4:
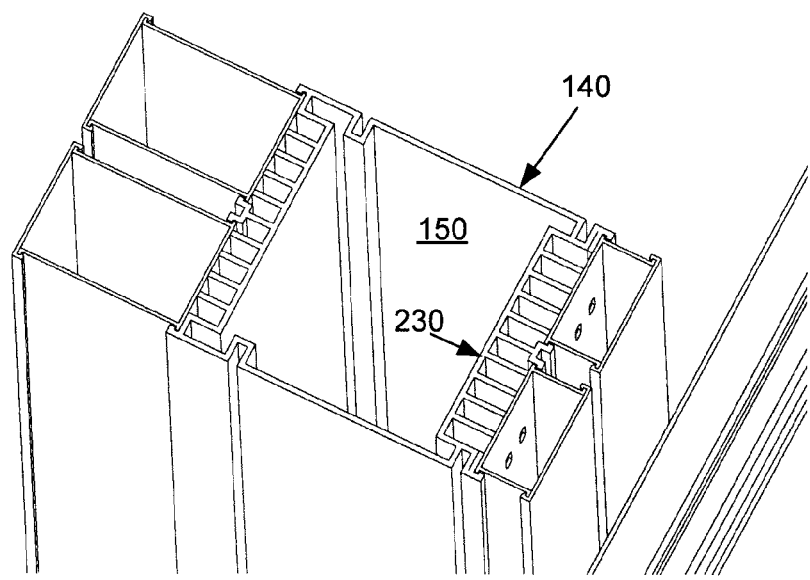
FIG. 4 is a perspective view of a portion of a support duct for use with the enclosure of FIG. 2.
Figure 5:
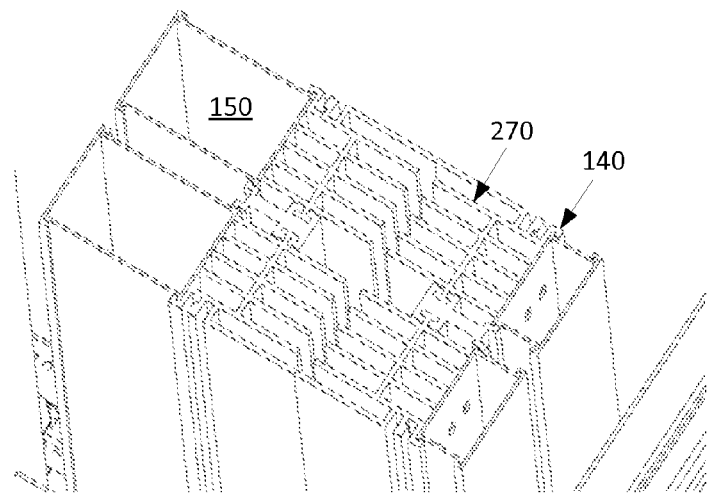
FIG. 5 is a perspective view of a portion of an alternative embodiment of a support duct for use with the enclosure of FIG. 2.

FIG. 4 shows a cross-section of an example of the support duct 140. The support duct 140 may include a number of the air channels 150 therein. Moreover, an internal fin structure 230 also may be used so as to facilitate heat exchange with the ambient airflow 160 passing therein. The fin structure 230 may have any size, shape, or configuration. Differing fin structures 230 may be used. For example, a further embodiment of a fin structure 270 is shown in FIG. 5. Other components and other configurations also may be used herein.

The enclosure 100 thus provides a sealed enclosure 200 to protect the electrical components 180 within the interior 190 thereof while being able to accommodate higher internal and ambient temperatures because of the use of the support ducts 140. The support ducts 140 act as a heat sink so as to dissipate the heat produced by the electric components 180 via contact with the rail 200 via the ambient airflow 160. The duct fans 170 promote the ambient airflow 160 either from the base 110 to the roof 120 or vice versa. Cooling also may be provided by free convection without the use of the duct fans 170. In other words, either forced or natural convection may be used herein. The internal fan 220 also circulates internal air about the support ducts 140 and the electrical components 180. The enclosure 100 thus may accommodate higher temperatures without admitting external air and contaminates into the interior 190 of the enclosure 100.

The enclosure 100 therefore may be used in relatively hot and dusty locations so as to control power plant equipment and the like with less wiring and infrastructure. Moreover, the overall structure of the enclosure 100 may be simplified so as to reduce manufacturing costs. Specifically, the support ducts 140 provide both support and act as a heat sink.

Figure 6:
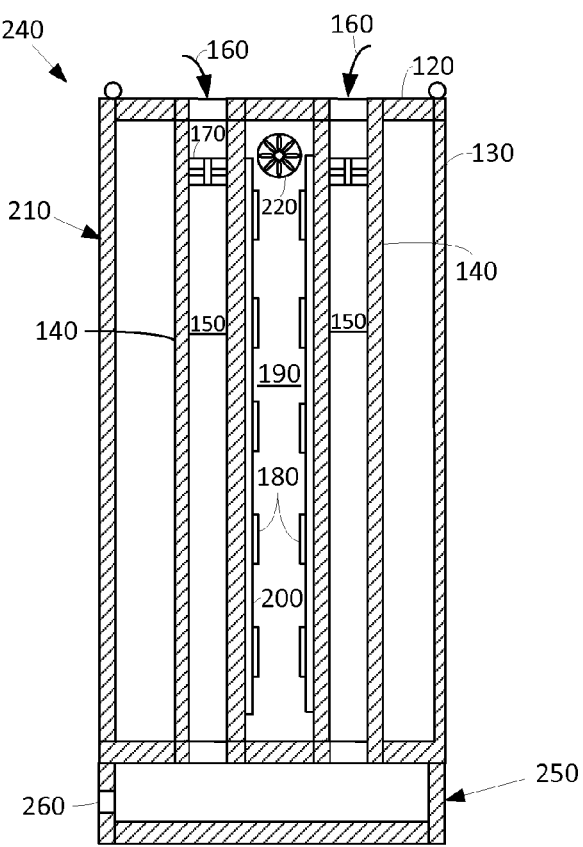
FIG. 6 is a side cross-sectional view of an alternative embodiment of an enclosure as may be described herein.

FIG. 6 shows an alternative embodiment of an enclosure 240. The enclosure 240 may be similar to the enclosure 100 described above but without the supports 225 positioned about the base 110. In this example, a base 250 may be an extended structure with a vent 260 in communication with the air channel 150. The base 250 also may have one or more vents 260 thereon for the flow of ambient air 160. The vents 260 may be positioned about a sidewall 130 or elsewhere. Other components and other configurations may be used herein.

It should be apparent that the foregoing relates only to certain embodiments of the present application and the resultant patent. Numerous changes and modifications may be made herein by one of ordinary skill in the art without departing from the general spirit and scope of the invention as defined by the following claims and the equivalents thereof.

I claim:

1. An enclosure for mounting electrical components therein, comprising:
   abuse;
   a roof;
   a plurality of side walls, wherein the base, the roof, and the plurality of sidewalls define a sealed interior of the enclosure;
   one or more support ducts extending from the base to the roof within the sealed interior of the enclosure, wherein the electrical components are attached to the one or more support ducts within the sealed interior of the enclosure; and
   an air channel disposed within the one or more support ducts, wherein the air channel extends from the base to the roof.

2. The enclosure of claim 1, wherein the one or more support ducts comprise a duct fan about the air channel.

3. The enclosure of claim 1, further comprising a rail positioned on the one or more support ducts and with the electrical components mounted thereon.

4. The enclosure of claim 3, wherein the rail comprises a thermally conductive material.

5. The enclosure of claim 1, wherein the one or more support ducts comprise a thermally conductive material.

6. The enclosure of claim 1, wherein the one or more support ducts comprise a plurality of fins positioned within the air channel.

7. The enclosure of claim 1, further comprising an interior fan.

8. The enclosure of claim 1, wherein the one or more support ducts comprise a pair of support ducts.

9. The enclosure of claim 1, wherein the base comprises a vent in communication with the air channel.

10. The enclosure of claim 9, wherein the vent is positioned about one or more of the plurality of sidewalls.

11. The enclosure of claim 9, wherein the base comprises one or more supports.

12. The enclosure of claim 1, wherein the air channel comprises a screen positioned about the base and/or the roof.

13. A method of operating electrical components, comprising:
    attaching the electrical components to a support duct within an interior of an enclosure;
    sealing the interior of the enclosure;
    providing a flow of ambient air through an air channel of the support duct from a base to a roof of the enclosure; and
    exchanging heat with the electrical components on the support duct and the flow of ambient air in the air channel.

14. A sealed enclosure for mounting electrical components therein, comprising:
    a base;
    a roof;
    a plurality of side walls, wherein the base, the roof, and the plurality of sidewalls define a sealed interior of the enclosure;
    a plurality of support ducts extending from the base to the roof within the sealed interior of the enclosure, wherein the electrical components are attached to the plurality of support ducts within the sealed interior of the enclosure;
    an air channel disposed within the plurality of support ducts, wherein the air channel extends from the base to the roof; and
    a duct fan positioned in the air channel of the plurality of support ducts.

15. The sealed enclosure of claim 14, further comprising a rail positioned on one or more of the plurality of support ducts and with the electrical components mounted thereon.

16. The sealed enclosure of claim 15, wherein the rail and the plurality of support ducts comprise a thermally conductive material.

17. The sealed enclosure of claim 14, wherein the plurality of support ducts comprises a plurality of fins positioned within the air channel.

18. The sealed enclosure of claim 14, further comprising an interior fan positioned about the plurality of support ducts.

19. The sealed enclosure of claim 14, wherein the air channel comprises a screen positioned about the base and/or the roof.

* * * * *